United States Patent
Baik et al.

(10) Patent No.: US 8,563,076 B2
(45) Date of Patent: Oct. 22, 2013

(54) SUBSTRATE STRUCTURE AND METHOD OF FORMING THE SAME

(75) Inventors: Chan Wook Baik, Seongnam-si (KR); Jong Seok Kim, Hwaseong-si (KR); Sun Il Kim, Seoul (KR); Young Mok Son, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 849 days.

(21) Appl. No.: 12/222,444

(22) Filed: Aug. 8, 2008

(65) Prior Publication Data

US 2009/0252938 A1    Oct. 8, 2009

(30) Foreign Application Priority Data

Apr. 3, 2008 (KR) .................. 10-2008-0031106
Jun. 4, 2008 (KR) .................. 10-2008-0052712

(51) Int. Cl.
*B32B 3/10* (2006.01)

(52) U.S. Cl.
USPC .......................................... 427/123; 428/209

(58) Field of Classification Search
USPC .................. 438/686, 678, 674, 654, 644, 637
See application file for complete search history.

(56) References Cited

U.S. PATENT DOCUMENTS

| | | | |
|---|---|---|---|
| 6,066,892 A * | 5/2000 | Ding et al. | 257/751 |
| 6,174,812 B1 * | 1/2001 | Hsiung et al. | 438/687 |
| 6,242,349 B1 | 6/2001 | Nogami et al. | |
| 6,268,265 B1 | 7/2001 | Hwang et al. | |
| 6,399,496 B1 * | 6/2002 | Edelstein et al. | 438/687 |
| 6,429,523 B1 * | 8/2002 | Andricacos et al. | 257/758 |
| 6,515,368 B1 * | 2/2003 | Lopatin et al. | 257/762 |
| 6,521,532 B1 * | 2/2003 | Cunningham | 438/687 |
| 6,528,412 B1 | 3/2003 | Wang et al. | |
| 2003/0057526 A1 * | 3/2003 | Chung et al. | 257/642 |
| 2004/0023486 A1 * | 2/2004 | Lopatin et al. | 438/639 |

(Continued)

FOREIGN PATENT DOCUMENTS

| | | |
|---|---|---|
| EP | 0713 957 A1 | 5/1996 |
| KR | 10-2000-0056452 | 9/2000 |
| KR | 10-2007-0063820 | 6/2007 |
| KR | 10-2007-0066426 | 6/2007 |

OTHER PUBLICATIONS

Qing Liu, B.E., M.E., M.S.E.E., "Quilt Packaging: A Novel High Speed Chip-To-Chip Communication Paradigm for System-In-Package," Graduate Program in Electrical Engineering, Dec. 2007, pp. 81-140.

(Continued)

*Primary Examiner* — Michael Cleveland
*Assistant Examiner* — Tabassom Tadayyon Eslami
(74) *Attorney, Agent, or Firm* — Harness, Dickey & Pierce, P.L.C.

(57) ABSTRACT

Provided are a substrate structure and method of forming the same. The method of forming the substrate structure may include etching a substrate to form an etched portion having a vertical surface, forming a diffusion material layer on the whole substrate or in part of the substrate; annealing the diffusion material layer to form a seed layer diffused downward toward the surface of the etched portion, and forming a metal layer on the seed layer. Accordingly, surface characteristics of the etched portion of the substrate may be enhanced by the seed layer, and therefore, a metal layer with improved adhesion and a uniform thickness may be formed on the vertical surface of the etched portion.

12 Claims, 9 Drawing Sheets

(56) References Cited

U.S. PATENT DOCUMENTS

2005/0277298 A1* 12/2005 Lin et al. .................. 438/687
2006/0166384 A1* 7/2006 Tatsumi ..................... 438/17
2007/0184654 A1* 8/2007 Akram et al. ............. 438/675

OTHER PUBLICATIONS

T.D. Drysdale et al., "Terahertz Tuneable Filters Made by Self-Releasing Deep Dry Etch Process," Microelectronic Engineering, No. 73-74, Jun. 2004, pp. 441-446.

M. Puech et al, "High Productivity DRIE Solutions for 3D-SiP and MEMS Volume Manufacturing," Journal of Physics: Conference Series 34, 2006, pp. 481-486.

O. Cojocari et al, "DC- and IF-Noise Performance Optimization of GaAs Schottky Diodes for THz Applications," Institute of Physics Publishing, Semicond. Sci, Technol. No. 20, Jan. 2005, pp. 23-32.

S. Sengele et al, "Selective Metallization for a W-band Meander Line TWT," 2007, $8^{th}$ International Vaccum Electronics conference, pp. 57-58.

R.B. Bass et al., "Ultra-Thin Silicon Beam Lead Chips for Superconducting Terahertz Circuits," European Conference on Applied Superconductivity, Sorrento (IT), Sep. 2003, pp. 1-8.

Chinese Office Action dated Apr. 28, 2012, issued in Chinese Application No. 2008101617249, with English translation.

Chinese Office Action dated Feb. 5, 2013, issued in Chinese Application No. 2008101617249, with English translation.

European Examination Report dated May 5, 2010, issued in European Application No. 08163834.8.

European Examination Report dated Sep. 17, 2010, issued in European Application No. 08163834.8.

* cited by examiner

SUBSTRATE STRUCTURE AND METHOD OF FORMING THE SAME

PRIORITY STATEMENT

This application claims priority under U.S.C. § 119 to Korean Patent Application No. 10-2008-0031106, filed on Apr. 3, 2008, and Korean Patent Application No. 10-2008-0052712, filed on Jun. 4, 2008, in the Korean Intellectual Property Office (KIPO), the entire contents of which are incorporated herein by reference.

BACKGROUND

1. Technical Field

Example embodiments relate to a substrate structure and method of forming the same. More particularly, example embodiments relate to a method of forming a substrate structure with an improved thin-film property on a surface of an etched portion having a vertical surface and a substrate structure formed using the same.

2. Discussion of the Related Art

The terahertz ($10^{12}$ Hz) band may be important in view of molecular optics, biophysics, medicine, imaging and security applications. When manufacturing devices, e.g., an oscillator, an amplifier and a waveguide, a circuit which allows different components to interact with one another may be necessary. Because an interactive circuit should be a conductor for electrical connection, the interactive circuit may be formed by metal patterning or other methods.

When a metal pattern is formed on a substrate, e.g., a silicon wafer, a structure may be formed by etching the substrate, and a metal layer may be formed using a method including plating, electron-beam (e-beam) deposition, or sputtering, so that the wall and bottom surfaces of the structure may be electrically connected to other electric components. However, if an under-etch is formed in the structure or the wall surface of the structure is formed non-uniformly in the etching process, forming a metal layer having a uniform wall surface and an improved adhesion property may be difficult.

When forming a pattern of a semiconductor substrate, forming a precise pattern may be important. Therefore, a dry etching method may be frequently used instead of a wet etching method in which an under-etch tends to be formed. However, a structure with rough wall surfaces may be attained even by the dry etching method, and therefore, forming a metal layer having an improved thin-film property and/or an improved adhesion property may be difficult.

SUMMARY

Therefore, example embodiments provide a method of forming a substrate structure, which may have an improved thin-film property and an improved adhesion property, and a substrate structure formed using the same.

A method of forming a substrate structure according to example embodiments may be as follows. An etched portion having a vertical surface may be formed by etching a substrate. A diffusion material layer may be formed on the whole substrate or in part of the substrate, and a seed layer may be formed by annealing the diffusion material layer. A metal layer may be formed on the seed layer. In example embodiments, the diffusion material layer and the metal layer may be formed not only on the surface of the etched portion but also on the top surface of the substrate.

In example embodiments, the diffusion material layer may be formed by depositing a metal using a physical vapor deposition (PVD) method or a chemical vapor deposition (CVD) method. A material selected from the group consisting of Au, Cu, Ag, Al, Sn, Au—Zn alloy, Au—Sn alloy, Au—Ge alloy, and Au—Be alloy, which may be diffused by annealing, may be used as the metal. In example embodiments, the process of annealing the diffusion material layer may be performed by heating the diffusion material layer at a temperature of about 300 to about 1000° C. under an atmosphere of vacuum, argon (Ar) or nitrogen ($N_2$).

In example embodiments, some of the diffusion material in the diffusion material layer may be diffused downward by annealing, toward the surface of the etched portion and the top surface of the substrate, and a seed layer may be formed in the shape of micrometer size or nanometer size grains. In example embodiments, the aforementioned method may further include forming an adhesive layer on the seed layer. The adhesive layer may be formed by depositing any one of Ti, Cr and Ni using a PVD or CVD method.

In example embodiments, the aforementioned method may further include forming an oxide layer on the surface of the substrate, including the etched portion, and removing the oxide layer, before forming the diffusion material layer.

In example embodiments, the substrate may be a silicon (Si) wafer, a silicon oxide ($SiO_2$) wafer, a silicon nitride ($Si_3N_4$) wafer, a silicon carbide (SiC) wafer, a Group III-V compound wafer, or a Group II-VI compound wafer. Etching the substrate may be achieved by performing a deep reactive ion etching (DRIE) process. According to example embodiments, a method of fabricating a terahertz device may include forming the substrate structure of example embodiments.

According to example embodiments, a substrate structure may include a substrate having an etched portion in a vertical direction, a metal layer on the whole substrate or in part of the substrate, and seed materials in part between the metal layer and the substrate, wherein the substrate includes in part a portion where the seed materials are diffused. The substrate structure may further include an adhesive layer between the seed materials and the metal layer, and the adhesive layer may include Ti, Cr and Ni. The seed materials may be formed by annealing a diffusion material layer formed in part of the substrate. The diffusion material layer may be made of a material selected from the group consisting of Au, Cu, Ag, Al, Sn, Au—Zn alloy, Au—Sn alloy, Au—Ge alloy, and Au—Be alloy.

In example embodiments, the substrate structure may include a top surface and a wall surface in different directions, the wall surface having receding portions and protruding portions, and a ripple shape, and the seed materials are grains at the receding portions and the protruding portions. The seed materials may be in part of the wall surface. The grains may have a size smaller than about 1 µm. At least part of the grains formed at the receding portions may be larger than at least part of the grains formed at the protruding portions. The substrate structure may further include an adhesive layer between the seed materials and the metal layer, and the adhesive layer may include any one or more of Ti, Cr and Ni. The wall surface may be perpendicular to the top surface. The substrate may include below the wall surface, at least in part, a portion where the seed materials are diffused. A terahertz device may include the substrate structure according to example embodiments.

BRIEF DESCRIPTION OF THE DRAWINGS

Example embodiments will be more clearly understood from the following detailed description taken in conjunction with the accompanying drawings. FIGS. 1A-12 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, a method of forming a substrate structure according to example embodiments will be described in detail with reference to the accompanying drawings. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 1I are cross-sectional views illustrating processes of forming a metal layer on an etched portion of a substrate according to example embodiments. The processes of forming a metal layer on an etched portion of a substrate according to example embodiments may be as follows. An etched portion having a vertical surface may be formed by etching a substrate. A diffusion material layer may be formed on the surfaces of the etched portion and the top surface of the etched substrate, and a seed layer may be formed by annealing the diffusion material layer. Subsequently, a metal layer may be formed on the seed layer.

Specifically, the process of forming an etched portion having a vertical surface by etching a substrate may include forming a first oxide layer 21 on the top surface of a substrate 10; forming an etching mask 30' on the first oxide layer 21; and etching the first oxide layer 21 and the substrate 10 using the etching mask 30'. Hereinafter, the respective processes will be described in detail.

Figure 1A:
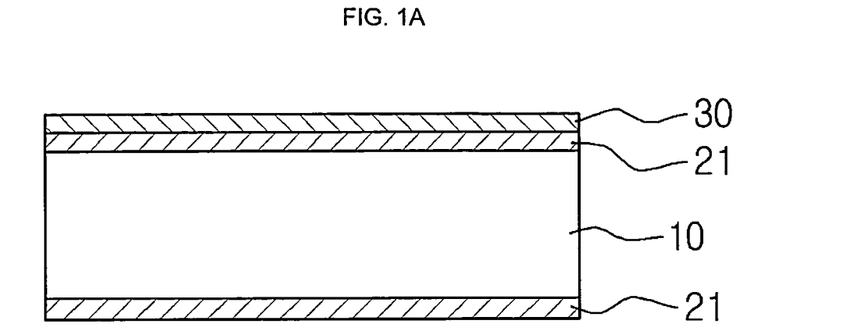
FIGS. 1A through 1I are cross-sectional views illustrating processes of forming a metal layer on an etched portion of a substrate according to example embodiments.

Referring to FIG. 1A, a first oxide layer 21 may be formed on a substrate 10 through an oxidizing process. In example embodiments, the substrate 10 may be a silicon (Si) wafer, a silicon oxide ($SiO_2$) wafer, a silicon nitride ($Si_3N_4$) wafer, a silicon carbide (SiC) wafer, a Group III-V compound wafer, or a Group II-VI compound wafer.

The first oxide layer 21 may be formed on both surfaces of the substrate 10 or only on the top surface of the substrate 10, which may be etched. When the substrate 10 is a silicon wafer, the first oxide layer 21 may be formed of silicon monoxide (SiO) or silicon dioxide ($SiO_2$) by a thermal oxidation method, for example. In the thermal oxidation method, the substrate may be exposed to a mixture of highly pure oxygen and hydrogen at a temperature of about 400 to 1200° C., and the mixture may be reacted with the interface of the substrate, thereby forming a first oxide layer of $SiO_2$. The first oxide layer 21 may be used as an insulating layer or a protection layer, and may be used as an etching mask in example embodiments.

Figure 1B:
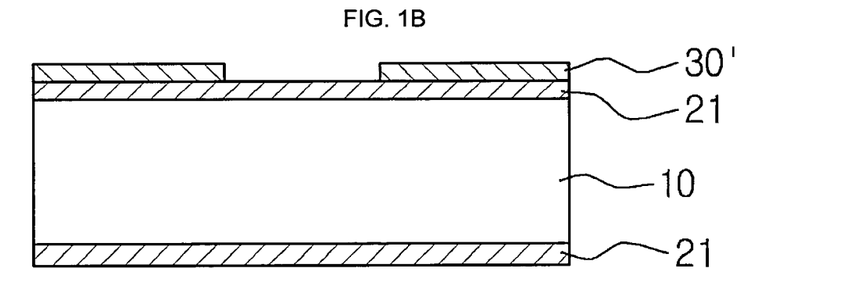

Subsequently, an etching mask 30' may be formed on the first oxide layer 21 as illustrated in FIG. 1B. The process of forming the etching mask 30' on the first oxide layer 21 is as follows. As illustrated in FIG. 1A, a photoresist 30 may be coated on the first oxide layer 21. The photoresist 30 may be coated by a spin coating method, and a positive-type photoresist in which an exposed portion may be removed by a developing process may be used as the photoresist 30. After coating the photoresist 30, soft baking may be performed with respect to the photoresist 30. Thereafter, a photomask (not shown) having a pattern of the etched portion engraved thereon may be provided above the photoresist 30, and the photoresist 30 may be exposed to, for example, ultraviolet light. The photomask 30 may be developed using a developer and subjected to hard baking, thereby forming an etching mask 30' as illustrated in FIG. 1B.

Figure 1C:
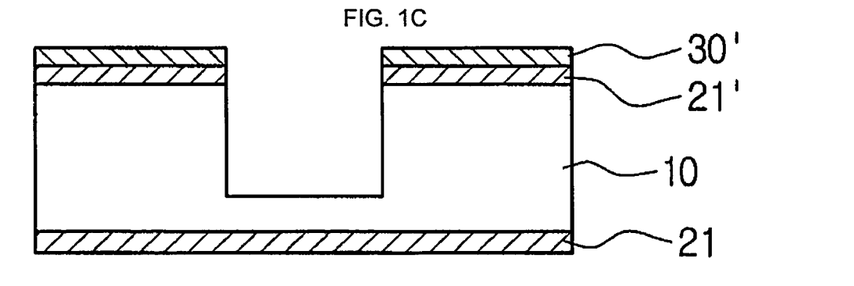
Figure 1D:
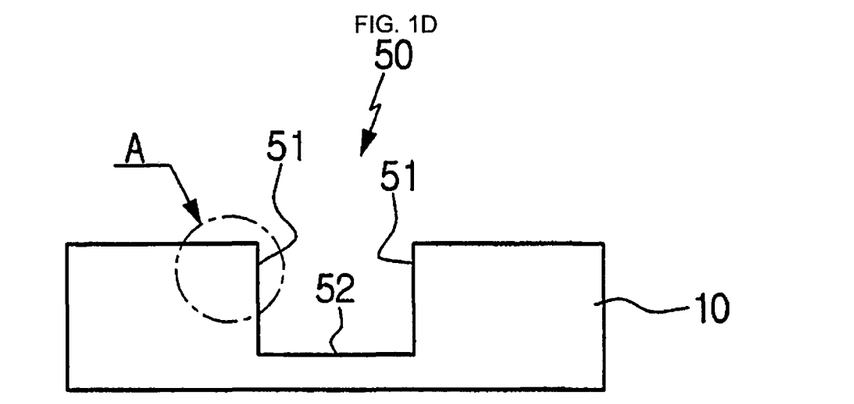

Subsequently, as illustrated in FIG. 1C, the first oxide layer 21 and the substrate 10 may be etched using the etching mask 30'. An oxide mask 21' may be formed by etching the first oxide layer 21 using the etching mask 30'. The first oxide layer 21 exposed through the etching mask 30' may be etched and removed. Thereafter, the exposed substrate 10 may be etched using the etching mask 30' and the oxide mask 21', thereby forming an etched portion 50 having a vertical surface 51 as illustrated in FIG. 1D.

The etching method of etching the substrate 10 may be divided into a wet etching method and a dry etching method. The wet etching method may be a method of removing a portion of the substrate 10 through a chemical reaction with the surface of the substrate 10 using a chemical solution. Because the wet etching method may be an isotropic etching, an undercut may occur, and forming a precise pattern may be difficult. Further, the wet etching method may have disadvantages in that controlling processes may be difficult, the line width to be etched may be restricted, and there may be a problem with treating an additionally produced etchant.

Therefore, the dry etching method, which may solve the disadvantages of the wet etching method, may be more frequently used. The dry etching method may be a method in which plasma is generated by injecting a reaction gas into a vacuum chamber and applying power, and the plasma may be chemically or physically reacted with the surface of the substrate 10 to remove a portion of the substrate 10.

In example embodiments, the etched portion 50 may be formed by the dry etching method with which processes may be more easily controlled, anisotropic etching may be performed, and a precise pattern may be attained. For example, the etched portion 50 may be formed through a deep reactive ion etching (DRIE), which may be a physical dry etching method. In the DRIE process, plasma may be generated by injecting a reactive gas into a vacuum chamber and dissociating the gas with an energy source. The substrate may be etched through sputtering by accelerating ions generated from the plasma in an electric field and allowing the ions to collide against the surface of the substrate 10.

The etched portion 50 may be formed in the shape of a hole, e.g., a via hole or in the shape of a groove, e.g., a trench. In example embodiments, a groove-shaped etched portion having a vertical surface 51 and a bottom surface 52 may be formed, as illustrated in FIG. 1D. After forming the etched portion in the substrate 10, the process of removing the oxide mask 21' and the etching mask 30' from the substrate may be performed as illustrated in FIG. 1D.

When the DRIE process is used, the etched portion 50 may be formed through a Bosch process of repeatedly etching and forming the protection layer. As a result, the vertical surface 51 of the etched portion 50 may not be uniform but may have ripple-shaped scallops. In example embodiments, the following processes may be performed to lessen the scallops and form a uniform metal layer on the vertical surface 51 of the etched portion 50.

Figure 1E:
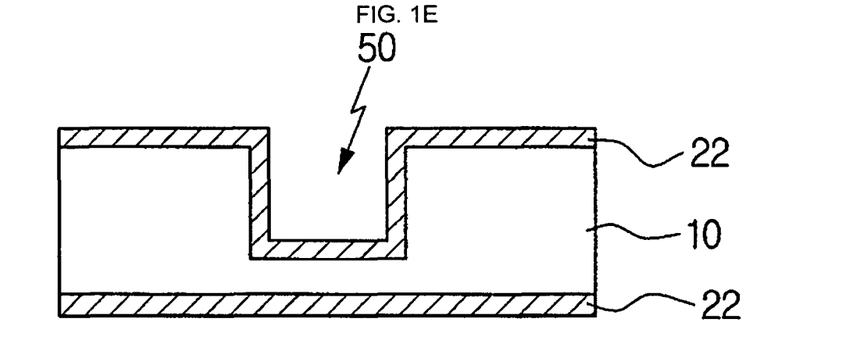
Figure 1F:
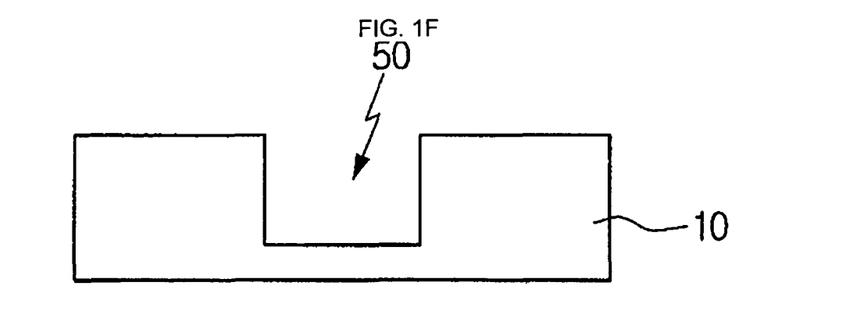
Figure 1G:
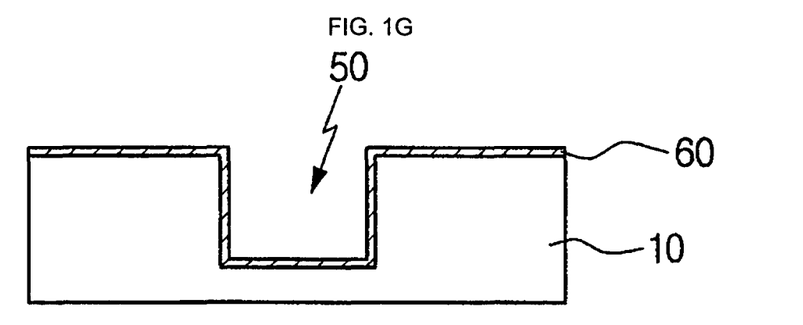
Figure 1H:
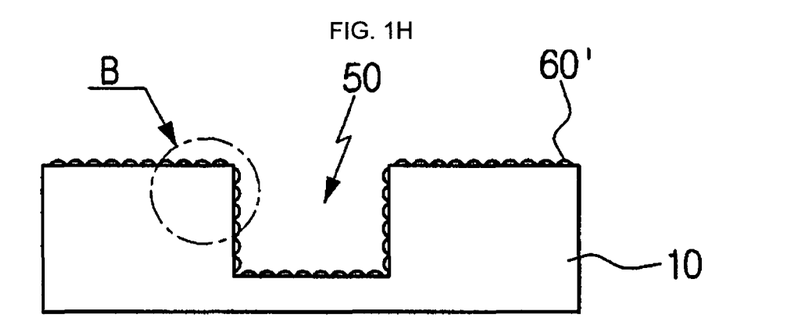

First, as illustrated in FIGS. 1E and 1F, the scallops of the vertical surface 51 of the etched portion 50 may be lessened through a process of forming a second oxide layer 22 on the surfaces of the substrate 10 and removing the second oxide layer 22. The process of forming and removing the second oxide layer 22 may be performed once or repeatedly up to three times. Subsequently, as illustrated in FIG. 1G, a diffusion material layer 60 may be formed on the surface of the etched portion 50 and the top surface of the etched substrate 10, and annealing may be performed with respect to the diffusion material layer 60, thereby forming a seed layer 60' as illustrated in FIG. 1H.

For example, the diffusion material layer 60 may be formed by depositing a metal, which may be diffused well through annealing, using a physical vapor deposition (PVD) method or a chemical vapor deposition (CVD) method. In example embodiments, the diffusion material layer 60 may be formed of a material selected from the group consisting of Au, Cu, Ag, Al, Sn, Au—Zn alloy, Au—Sn alloy, Au—Ge alloy, and Au—Be alloy. Sputtering or e-beam evaporation may be used as the PVD method. The diffusion material layer 60 may be deposited with a thickness suitable for forming a metal layer. In example embodiments, the diffusion material layer 60 may be deposited to a thickness of about 10 to about 5000 Å.

The seed layer 60' may be formed by annealing the diffusion material layer 60 under an atmosphere of vacuum, argon (Ar) or nitrogen ($N_2$). The annealing process may be performed at a temperature at which the metal of the diffusion material layer 60 may be diffused sufficiently on the surface of the etched portion 51 and the top surface of the substrate 10, for example, at about 300 to about 1000° C. The metal constituting the diffusion material layer 60 may be diffused through the annealing process and aggregated, thereby forming the seed layer 60' with an improved adhesion property.

Figure 1I:
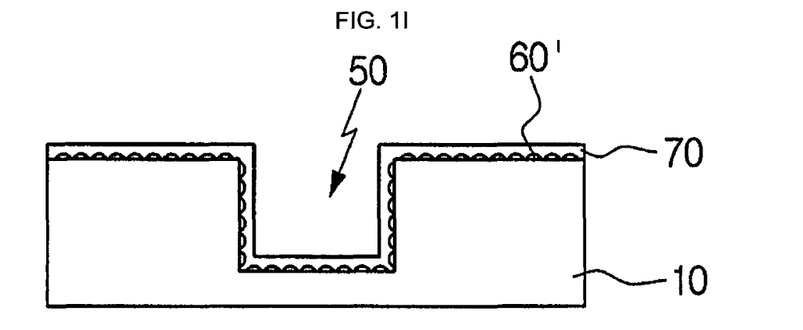

By the diffusion through the annealing process, some substances constituting the seed layer 60' may be diffused downward, toward the surface of the etched portion 51 and the top surface of the substrate 10. As a result, surface characteristics of the surface of the etched portion 51 and the top surface of the substrate 10 may be improved, and so may be the adhesion between the substrate 10 and a metal layer 70 (as illustrated in FIG. 1I). The seed layer 60' may include submicron-sized or nano-sized grains.

A metal layer 70 may be formed on the seed layer 60' as illustrated in FIG. 1I. The metal layer 70 may be formed by various methods including plating, sputtering and e-beam evaporation. The metal layer 70 may be formed to a desired thickness using a metallic material to be formed on the etched portion 50 of the substrate 10. The metal layer 70 may be formed on the top surface of the substrate 10 and on the surface of the etched portion 50. The seed layer 60' may provide improved adhesion of the metal layer 70 to the substrate 10 and the etched portion 50, and therefore, preventing or reducing the metal layer 70 from being peeled off the top surface of the substrate 10 and the surface of the etched portion 50 may be possible. In addition, the scallops of the vertical surface 51 of the etched portion 50 may be lessened, and therefore, uniformity of the vertical surface 51 may be enhanced. As a result, the metal layer 70 formed on the vertical surface 51 may have a uniform thickness.

Figure 2:
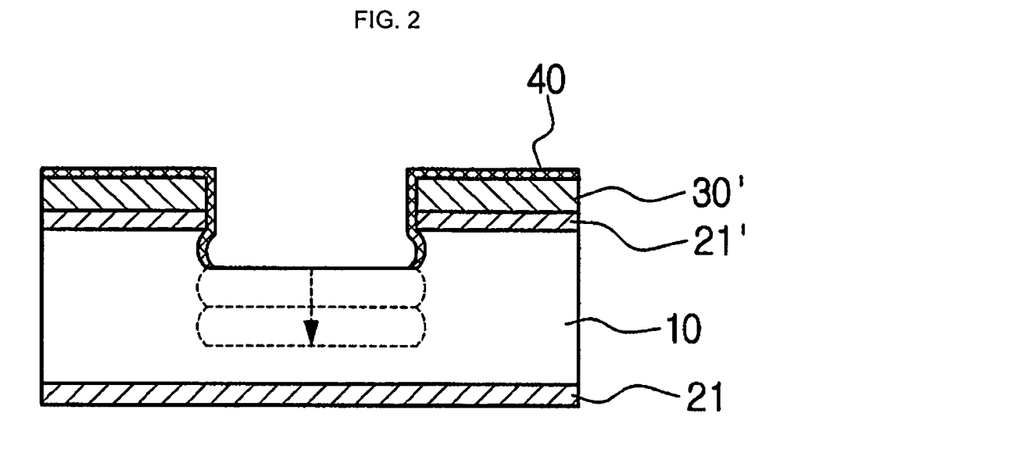
FIG. 2 is a cross-sectional view illustrating a process of forming the etched portion through a deep reactive ion etching (DRIE) process.

FIG. 2 is a cross-sectional view illustrating a process of forming the etched portion 50 illustrated in FIG. 1C through a DRIE process. Referring to FIG. 2, the DRIE process may include a Bosch process of repeatedly etching and forming the protection layer 40, and vertical etching may be achieved by repeatedly performing the respective steps. For example, the substrate 10 may be etched using $SF_6$, and the process of forming a protection layer in an etched region may be performed repeatedly using $C_4F_8$. As a result, vertical etching may be performed from the top surface to a lower portion of the substrate 10 as illustrated in FIG. 2, and the etched portion 50 illustrated in FIG. 1C may be formed.

Figure 3:
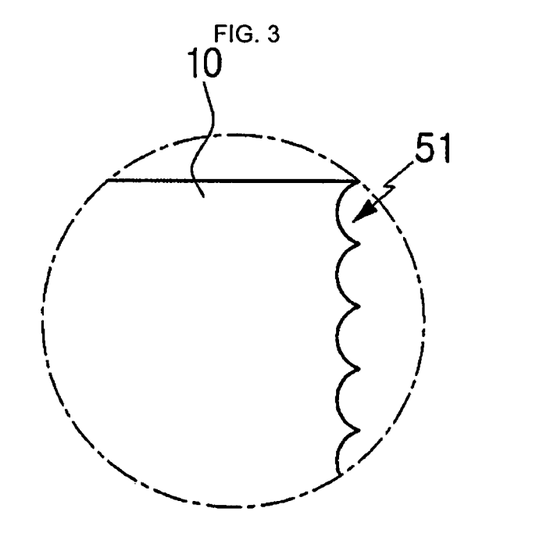
FIG. 3 is a partial enlarged view of portion "A" illustrated in FIG. 1D.
Figure 4:
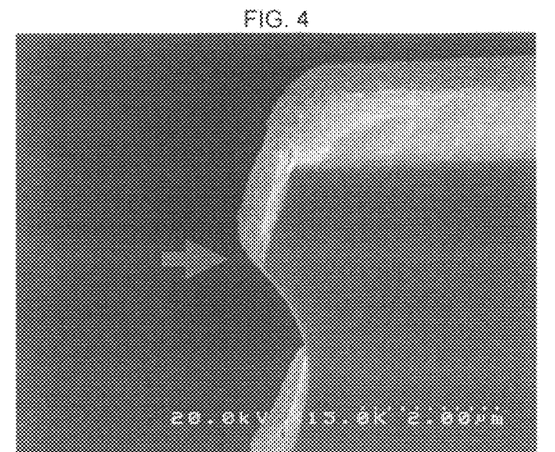
FIG. 4 is a scanning electron microscopy (SEM) photograph showing a vertical surface of the etched portion illustrated in FIG. 1D.

FIGS. 3 and 4 are views illustrating scallops produced through the aforementioned Bosch process. FIG. 3 is a partial enlarged view of portion "A" illustrated in FIG. 1D, and FIG. 4 is a scanning electron microscopy (SEM) photograph showing a vertical surface of the etched portion illustrated in FIG. 1D.

Referring to FIGS. 3 and 4, during the process of etching the substrate 10, the resultant vertical surface 51 of the etched portion 50 may not be uniform, but ripple-shaped scallops may be formed by the Bosch process. Thus, when a metal layer is formed on the surface of the etched portion 50, the metal layer may be deposited along the ripple shape of the vertical surface 51, and therefore, a uniform metal layer may not be formed. When forming the metal layer, the portions protruding sharply from the vertical surface 51 of the etching portion 50 may protrude further, deposition may occur relatively thinly or not at the portions receding deeply inward, because of the scallops.

Figure 5:
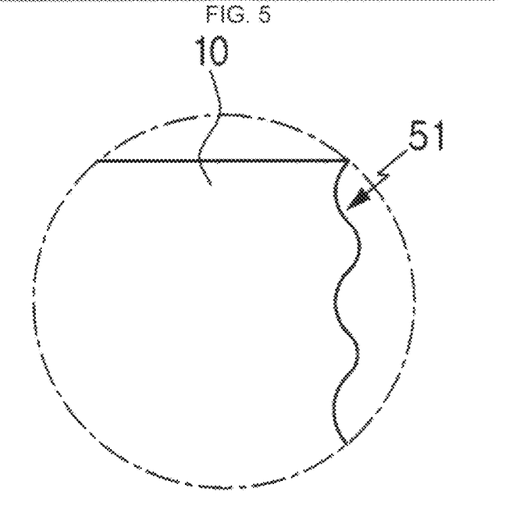
FIG. 5 is a cross-sectional view showing a vertical surface of the etched portion illustrated in FIG. 1F.

FIG. 5 is a cross-sectional view showing the vertical surface of the etched portion illustrated in FIG. 1F, on which scallops may be lessened by the second oxide layer. Through the process of removing the second oxide layer, the portions protruding sharply from the vertical surface 51 of the etched portion 50 may be removed together, and the scallops may be lessened as illustrated in FIG. 5.

Figure 6:
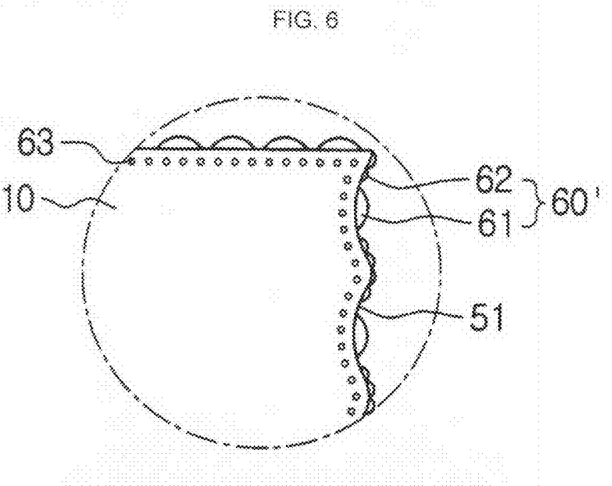
FIG. 6 is a partial enlarged view of portion "B" illustrated in FIG. 1H.
Figure 7:
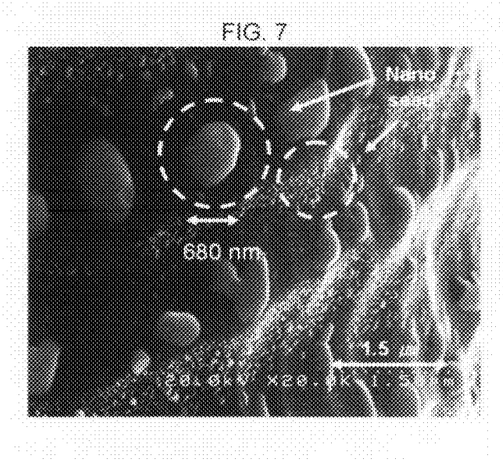
FIG. 7 is an SEM photograph showing a seed layer formed on the etched portion illustrated in FIG. 1H.

FIG. 6 is a partial enlarged view of portion "B" after forming the seed layer illustrated in FIG. 1H. FIG. 7 is an SEM photograph showing a seed layer formed on the etched portion illustrated in FIG. 1H. For reference, in FIG. 7, a diffusion material layer with a thickness of about 500 Å may be formed by depositing gold (Au) on the surface of the etched portion and the top surface of the substrate using an e-beam deposition method, and a seed layer may be formed by raising temperature up to about 550° C. over about 40 minutes and heating the diffusion material for about 10 minutes.

As illustrated in FIGS. 6 and 7, the seed layer 60' formed according to example embodiments may be formed uniformly on the receding and protruding portions of the vertical surface 51 of the etched portion. A portion of the seed layer 60' designated by a dotted line 63 may be diffused downward, toward the vertical surface 51 of the etched portion 50 and the top surface of the substrate 10, by annealing of the diffusion material layer.

Because of the scallops, grains 61, which are a few hundred-nanometer sized, may be formed uniformly on the receding portions of the vertical surface 51, and nanometer-sized fine grains 62 may be formed uniformly and densely on the protruding portions. Therefore, the scallops of the vertical surface 51 of the etched portion 50 may be lessened, and a seed layer 60' with an improved adhesion property may be formed on the vertical surface 51 of the etched portion 50.

Figure 8A:
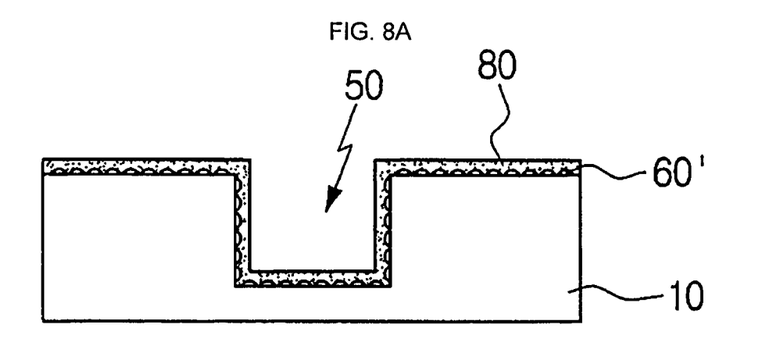
FIGS. 8A and 8B are cross-sectional views illustrating processes of forming a metal layer on an etched portion of a substrate according to example embodiments.
Figure 8B:
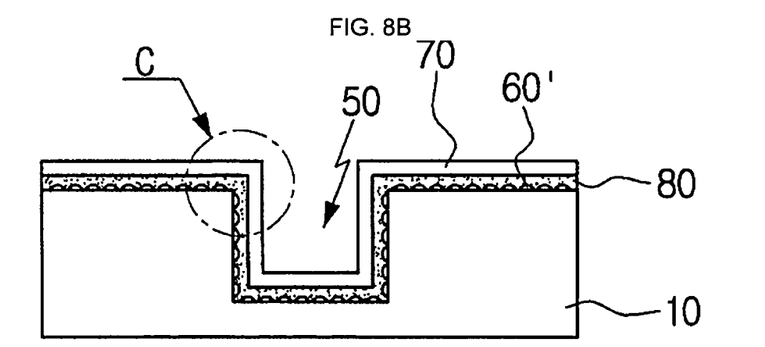

FIGS. 8A and 8B are cross-sectional views illustrating processes of forming a metal layer on an etched portion of a substrate according to example embodiments. Referring to FIGS. 8A and 8B, before forming a metal layer 70 on a seed layer 60', an adhesive layer 80 may be formed on the seed layer 60'. The adhesive layer 80 may be formed between the seed layer 60' and the metal layer 70 in order to enhance the adhesion of the metal layer 70, in case that the metal layer 70 may be formed relatively thickly or the seed layer 60' and the metal layer 70 may be formed of different metallic materials.

For example, the adhesive layer 80 may be formed by depositing any one of Ti, Cr and Ni to a thickness of about 10 to about 10,000 Å, using a PVD method, e.g., thermal evaporation and e-beam evaporation or a CVD method. After depositing the adhesive layer 80, a metal layer 70 may be formed on the adhesive layer 80 as illustrated in FIG. 8B. The adhesion of the metal layer 70 to the substrate 10 and the etched portion 50 may be enhanced by the adhesive layer 80.

Figure 9:
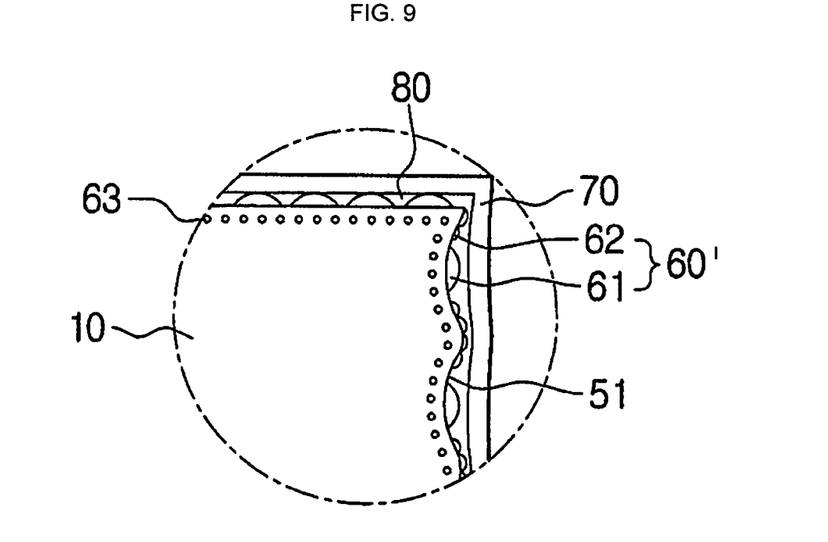
FIG. 9 is a partial enlarged view of portion "C" illustrated in FIG. 8B.

FIG. 9 is a partial enlarged view of portion "C" illustrated in FIG. 8B. As illustrated in FIG. 9, the scallops of the vertical surface 51 of the etched portion 50 may be lessened, and therefore, the adhesive layer 80 and the metal layer 70 may be formed with a uniform thickness on the vertical surface 51 of the etched portion 50. The adhesion of the metal layer 70 to the vertical surface 51 of the etched portion 50 may be enhanced by the seed layer 60' and the adhesive layer 80, and therefore, preventing or reducing the metal layer 70 from being peeled off the substrate 10 may be possible. As a result, when forming an electric contact with another electronic component using the metal layer 70 formed on the etched portion of the substrate 10, preventing or reducing the occurrence of a circuit open and/or short problem may be possible, and therefore, reliability may be ensured.

Because of the scallops, grains 61, which are few hundred-nanometer sized, may be formed uniformly on the receding portions of the vertical surface 51, and nanometer-sized fine grains 62 may be formed uniformly and densely on the protruding portions. Therefore, the scallops of the vertical surface 51 of the etched portion 50 may be lessened, and a seed layer 60' with an improved adhesion property may be formed on the vertical surface 51 of the etched portion 50.

Figure 10A:
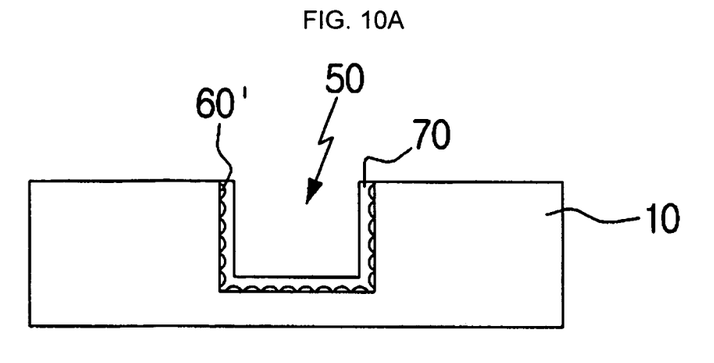
FIGS. 10A and 10B are cross-sectional views illustrating processes of forming a metal layer on an etched portion of a substrate according to example embodiments.
Figure 10B:
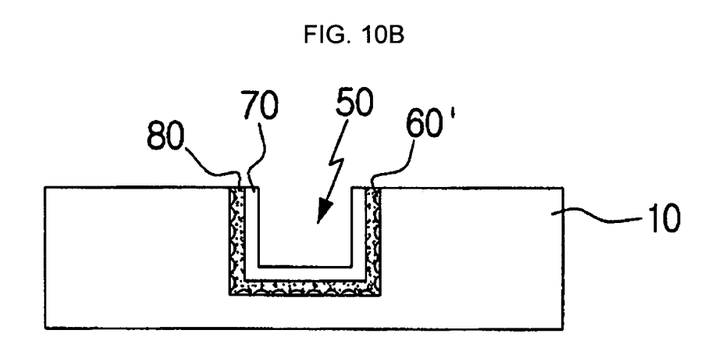

FIGS. 10A and 10B are cross-sectional views illustrating the processes of forming a metal layer on an etched portion of a substrate according to example embodiments. Referring to FIG. 10A, a diffusion material layer (not shown) may be formed only on the surface of an etched portion 50 and not on the top surface of a substrate 10. If the top surface of the etched substrate 10 is covered by a mask (not shown) and a diffusion material layer is deposited on the substrate 10, the diffusion material layer may be formed only on the surface of the etched portion 50. A seed layer 60' may be formed by annealing the diffusion material layer formed on the surface of the etched portion 50.

If a metal layer 70 is formed on the substrate 10 without removing the mask, the metal layer 70 may be formed on the seed layer 60' which may be formed on the surface of the etched portion 50. Thereafter, a metal layer illustrated in FIG. 10A may be formed on the etched portion 50 of the substrate 10 by removing the mask from the substrate 10.

Referring to FIG. 10B, in example embodiments illustrated in FIG. 10A, an adhesive layer 80 may be formed on the seed layer 60' before forming the metal layer 70 on the seed layer 60'. As described with reference to FIGS. 8 and 9, the adhesive layer 80 formed on the seed layer 60' may function to enhance the adhesion between the seed layer 60' and the metal layer 70.

Figure 11:
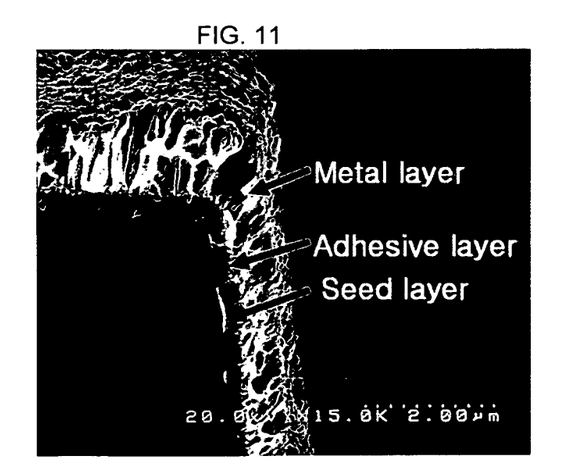
FIG. 11 is an SEM photograph showing a metal layer formed on an etched portion of a substrate according to example embodiments.

FIG. 11 is an SEM photograph showing a metal layer formed on an etched portion of a substrate according to example embodiments. For reference, in FIG. 11, after forming the seed layer illustrated in FIG. 7, an adhesive layer with a thickness of about 5000 Å may be formed by depositing Ti on the seed layer through e-beam deposition, and a metal layer with a thickness of about 15,000 Å may be formed by depositing gold (Au) on the adhesive layer through e-beam evaporation.

As illustrated in FIG. 11, the vertical surface of the etched portion may have scallops lessened by the seed layer and the process of forming and removing the second oxide layer. Therefore, adhesive and metal layers with a uniform thickness may be deposited on the vertical surface of the etched portion. Further, the adhesion property of the metal layer may be enhanced by the seed and adhesive layers, and therefore, preventing or reducing the metal layer from being peeled off the substrate may be possible.

The method of forming a metal layer on an etched portion of a substrate according to example embodiments may be applied to processes of manufacturing an amplifier, a waveguide, and a resonator. Further, example embodiments provide a substrate having a metal layer formed by the method of forming a metal layer on an etched portion of a substrate according to example embodiments. Furthermore, the substrate having the metal layer formed by the method of forming a metal layer on an etched portion of a substrate according to example embodiments may be applied to a terahertz oscillator, a terahertz amplifier, and a terahertz waveguide.

Figure 12:
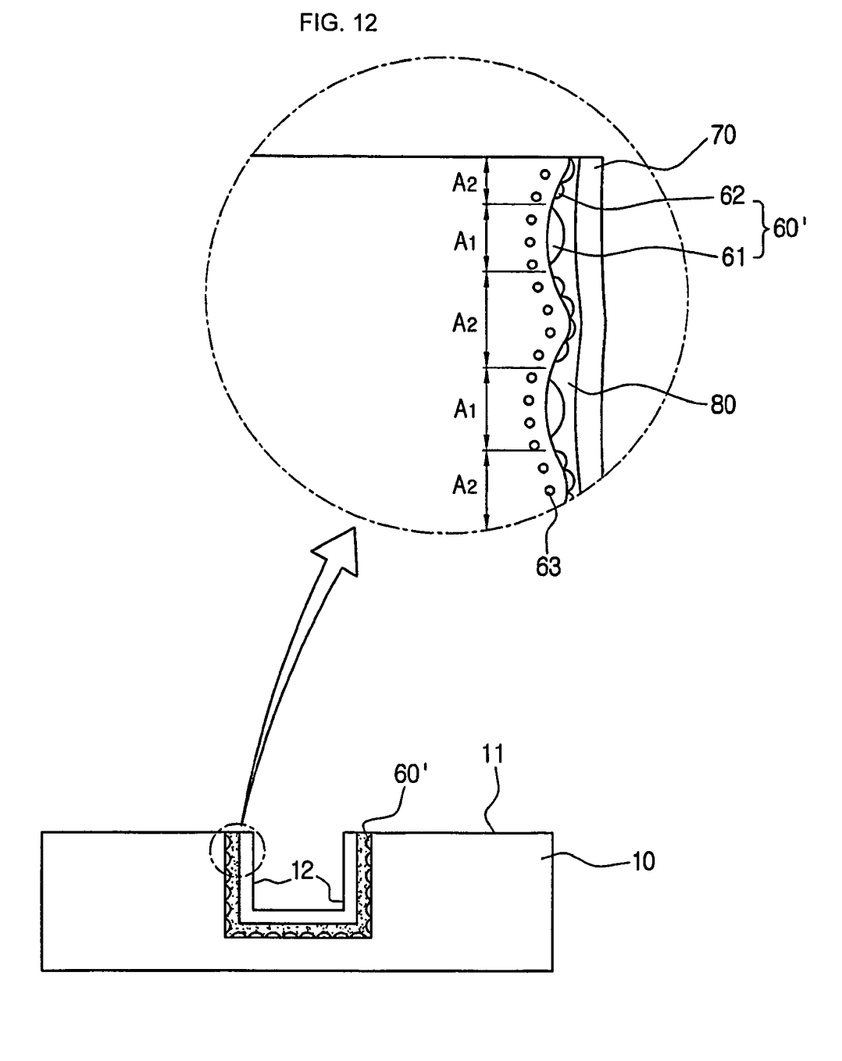
FIG. 12 is a cross-sectional view showing a structure according to example embodiments.

FIG. 12 is a cross-sectional view showing a structure according to example embodiments. In FIG. 12, the same reference numerals as in FIG. 1A through FIG. 11 refer to the same or equivalent components. Referring to FIG. 12, a structure according to example embodiments may include a substrate 10, seed materials 60' and a metal layer 70. The substrate 10 may have a top surface 11 and a wall surface 12 formed in different directions. The wall surface 12 may have receding portions A1 and protruding portions A2. Thus, the wall surface 12 may look like a ripple. In example embodiments, the top surface 11 and the wall surface 12 may be perpendicular to each other. There may be partially diffused seed materials 63 beneath the wall surface 12 of the substrate 10.

The seed materials 60' may be formed at the receding portions A1 and the protruding portions A2 of the wall surface 12, at least in part of the wall surface 12. The seed materials 60' may be formed as grains. In example embodiments, the grains may be submicron-sized or nano-sized grains. For example, the seed materials 60' may be grains with a size smaller than about 1 μm. In example embodiments, the seed materials 60' may be formed such that grains 61 formed at the receding portions A1 may be larger in size than grains 62 formed at the protruding portions A2.

An adhesive layer 80 may be formed between the seed materials 60' and the metal layer 70. The adhesive layer 80 may comprise, for example, any one of Ti, Cr and Ni, and may be formed using a PVD method, e.g., thermal evaporation and e-beam evaporation or a CVD method, to a thickness of about 10 to about 10,000 Å. Although the structure illustrated in FIG. 12 may have the adhesive layer 80, according to example embodiments, the metal layer 70 may be formed directly on the seed materials 60' without the adhesive layer 80.

The structure according to example embodiments may prevent or reduce the metal layer from being peeled off the substrate, because the adhesion between the wall surface and the metal layer may be improved by the seed materials diffused on the wall surface. Further, the structure may be applied to a terahertz oscillator, a terahertz amplifier, and a terahertz waveguide.

While example embodiments have been particularly shown and described with reference to example embodiments thereof, it will be understood by those of ordinary skill in the art that various changes in form and details may be made therein without departing from the spirit and scope of example embodiments as defined by the following claims. Therefore, the scope of example embodiments should be understood within the scope defined by the appended claims.

What is claimed is:

1. A method of forming a substrate structure, comprising:
    etching a substrate to form an etched portion having a bottom surface and a vertical surface;
    forming a diffusion material layer on the whole substrate or at least on the bottom surface and vertical surface of the etched portion of the substrate;
    annealing the diffusion material layer to form a seed layer diffused into the bottom surface and the entire vertical surface of the etched portion of the substrate; and
    after the annealing the diffusion material layer, forming a metal layer on the seed layer.

2. The method according to claim 1, wherein the diffusion material layer is deposited to a thickness of about 10 to about 5000 Å.

3. The method according to claim 1, wherein annealing the diffusion material layer is performed by heating the diffusion material layer at a temperature of about 300 to about 1000° C. under an atmosphere of argon (Ar) or nitrogen ($N_2$).

4. The method according to claim 1, wherein the seed layer has the shape of micrometer sized or a nanometer sized grains.

5. The method according to claim 1, before forming the metal layer, further comprising:
    forming an adhesive layer on the seed layer.

6. The method according to claim 5, wherein the adhesive layer is formed by depositing any one of Ti, Cr and Ni using a PVD or CVD method.

7. The method according to claim 1, before forming the diffusion material layer, further comprising:
    forming an oxide layer on a surface of the substrate comprising the etched portion; and
    removing the oxide layer, wherein forming and removing the oxide layer are performed once or more.

8. The method according to claim 1, wherein the substrate is a silicon (Si) wafer, a silicon oxide (SiO$_2$) wafer, a silicon nitride (Si$_3$N$_4$) wafer, a silicon carbide (SiC) wafer, a Group II-V compound wafer, or a Group II-VI compound wafer.

9. The method according to claim 1, wherein forming the etched portion comprises:
   forming an oxide layer on a top surface of the substrate;
   forming an etching mask on the oxide layer; and
   etching the oxide layer and the substrate using the etching mask.

10. A method of fabricating a terahertz device comprising forming the substrate structure according to claim 1.

11. The method of claim 1, wherein the forming the metal layer on the seed layer comprises forming the metal layer along exposed surfaces of the seed layer such that the etched portion of the substrate is not completely filled by the seed layer and the metal layer.

12. The method of claim 1, wherein the metal layer is formed after the annealing the diffusion material layer.

\* \* \* \* \*